(12) United States Patent
Figueroa et al.

(10) Patent No.: US 8,088,658 B2
(45) Date of Patent: Jan. 3, 2012

(54) THIN FILM CAPACITOR AND METHOD OF FABRICATION THEREOF

(75) Inventors: Juan Carlos Figueroa, Wilmington, DE (US); Damien Francis Reardon, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/431,298

(22) Filed: Apr. 28, 2009

(65) Prior Publication Data

US 2010/0270261 A1 Oct. 28, 2010

(51) Int. Cl.
*H01L 21/8242* (2006.01)
*H01L 21/20* (2006.01)

(52) U.S. Cl. ........ 438/239; 438/123; 438/244; 438/253; 438/393; 438/396; 257/E21.008; 257/E21.048

(58) Field of Classification Search ........... 257/E21.008, 257/E21.048
See application file for complete search history.

(56) References Cited

U.S. PATENT DOCUMENTS

| | | | |
|---|---|---|---|
| 5,262,920 A * | 11/1993 | Sakuma et al. ............ | 361/321.5 |
| 6,461,493 B1 | 10/2002 | Farooq et al. | |
| 6,525,921 B1 | 2/2003 | Nakatani et al. | |
| 6,541,137 B1 | 4/2003 | Kingon | |
| 6,649,930 B2 | 11/2003 | Farrell | |
| 6,838,353 B1 | 1/2005 | Robinson | |
| 6,839,219 B2 * | 1/2005 | Mashiko et al. ............ | 361/311 |
| 6,841,080 B2 | 1/2005 | Kingon | |
| 7,029,971 B2 | 4/2006 | Borland | |
| 7,150,767 B1 * | 12/2006 | Schneider et al. ........... | 29/25.03 |
| 7,190,016 B2 * | 3/2007 | Cahalen et al. ............ | 257/310 |
| 2002/0020836 A1 | 2/2002 | Kikuchi et al. | |
| 2004/0262537 A1 * | 12/2004 | Leblans ..................... | 250/484.4 |
| 2006/0281278 A1 * | 12/2006 | Min .............................. | 438/396 |
| 2007/0049026 A1 | 3/2007 | Miyamoto | |
| 2008/0049379 A1 * | 2/2008 | Van Buskirk et al. ..... | 361/321.5 |
| 2009/0035913 A1 * | 2/2009 | Bao et al. ...................... | 438/393 |

OTHER PUBLICATIONS

International Search Report, PCT/US2010/032678, Dated Nov. 26, 2010.

* cited by examiner

*Primary Examiner* — Mohsen Ahmadi

(57) ABSTRACT

Methods for fabricating a capacitor are provided. In the methods, a dielectric may be formed on a metal (e.g. nickel) substrate, and a copper electrode is formed thereon, followed by the thinning of the metal substrate from its non-coated face, and subsequently forming a copper electrode on the thinned, non-coated face of the substrate.

8 Claims, 1 Drawing Sheet

THIN FILM CAPACITOR AND METHOD OF FABRICATION THEREOF

TECHNICAL FIELD

This invention relates to a thin film capacitor and a method of fabricating such a capacitor.

BACKGROUND

Embedded capacitors are being developed by the semiconductor industry to address increasing demands for miniaturization and faster clock speeds. Such devices consist of a high permittivity dielectric layer sandwiched between a foil substrate electrode and a top electrode, where both electrodes are typically copper. The coating of a thin dielectric layer onto a metallic foil can be accomplished by processes such as reactive sputtering, laser ablation, metallo-organic chemical vapor deposition, liquid source misted chemical deposition, chemical solution deposition, spin coating or spraying, or dipping. In substantially all cases, however, the deposited dielectric layer is thermochemically processed after deposition by heat treating the organometallic precursors therein to first remove their organic molecular constituents, and subsequently to sinter and crystallize the inorganic residue to provide a dielectric layer with useful properties.

In manufacturing a thin film capacitor ("TFC"), where dielectric oxide precursors are deposited on a metal foil electrode, it is desirable to be able to process the dielectric oxide precursor formulation in oxygen and at a high temperature because the dielectric layer needs oxygen during its thermal processing so that a dielectric layer with dense, large grains is obtained that will be characterized by high permittivity, low loss and high insulation resistance. At elevated oxygen pressures, however, there is a risk that the metal in the substrate will oxidize, and high temperatures may approach the melting point of the metal in the substrate and/or cause the metal to lose its integrity.

Moreover, the high temperature processing of the dielectric layer may induce the formation of defects within the dielectric, and/or at the dielectric/substrate interface, resulting from microstructural and chemical changes experienced by the metal foil substrate. Grain boundaries intersecting the surface of a metal foil substrate on which a dielectric layer is deposited can act as defect sources during the synthesis of the dielectric layer.

Copper-based foil substrate electrodes are preferred because of their ready availability, higher electronic conductivity, and the vast know-how in the industry relative to integration of this material in the form of an embedded component. However, the poor oxidation resistance and lower melting point of copper-based compositions, and their tendency toward thermal migration and outgassing, seriously reduce the upper limits in oxygen partial pressure and processing temperature that can be used to manufacture a TFC on a copper substrate. For example, copper electrical conductors experience oxidation when held in air at temperatures higher than 100° C., which results in decreases in conductivity and strength. In addition, when copper is used as a thin metallic foil, the thin cross section weakens the mechanical robustness of the foil making it quite susceptible to handling damage in the form of wrinkles as a result of fabrication steps prior to, during and after the deposition of the dielectric layer.

To address some of the deficiencies of copper-based foil substrates, substrates have been prepared with other metals such as nickel. For example, U.S. Pat. No. 6,841,080 discloses a method of forming a multi-layer foil comprising depositing a barrier layer of nickel phosphorus on a conductive metal layer by a metal deposition method selected from the group consisting of electroless plating, electrolytic plating, sputtering or vacuum plating.

U.S. Pat. No. 6,541,137 discloses a multi-layer foil comprising a copper layer of about 10 to about 50 µm thickness having a barrier layer composing about 1 to about 3 µm thickness nickel phosphorus disposed on one of the copper foil faces, wherein the phosphorus concentration of the nickel phosphorus layer is about 4 to about 11 wt %.

U.S. Pat. No. 6,649,930 discloses a nickel-coated copper foil substrate. And, U.S. Pat. No. 7,190,016 discloses a barrier layer having a thickness of 0.5 to 2 µm disposed on each of the faces of a copper foil, wherein the barrier layer is an electrodeposited nickel layer comprising less than 3 atomic percent of copper.

A need nevertheless remains for materials and techniques that can be used to provide a high permittivity TFC without hindrance from the problems caused by copper as a choice of substrate metal.

SUMMARY

One object of this invention is to provide a capacitor in which a dielectric layer has been crystallized on a non-copper substrate. The inventions disclosed herein thus include methods for the fabrication of a capacitor, the use of such methods, and the capacitors obtained and obtainable by such methods.

One particular embodiment of the methods of the inventions hereof provides a method of fabricating a capacitor by (a) providing a non-copper metal substrate that has first and second surfaces; (b) depositing a dielectric material on the first surface of the metal substrate to form a dielectric layer thereon; (c) depositing a conductive material on the dielectric layer to form an electrode thereon; (d) removing metal from the second surface of the metal substrate to reduce the thickness of the metal substrate; and (e) depositing a conductive material on the second surface of the metal substrate to form an electrode thereon.

Yet another embodiment of the inventions hereof is a capacitor substantially as shown or described in FIG. 1.

It is found that a capacitor of this invention, and a capacitor fabricated by a method of this invention, has a current carrying capacity that is as high as any conventional copper electrode capacitor, but has a dielectric layer that is not characterized by performance degradation as can be caused by defects introduced during the crystallization of the dielectric layer.

DETAILED DESCRIPTION

Figure 1:
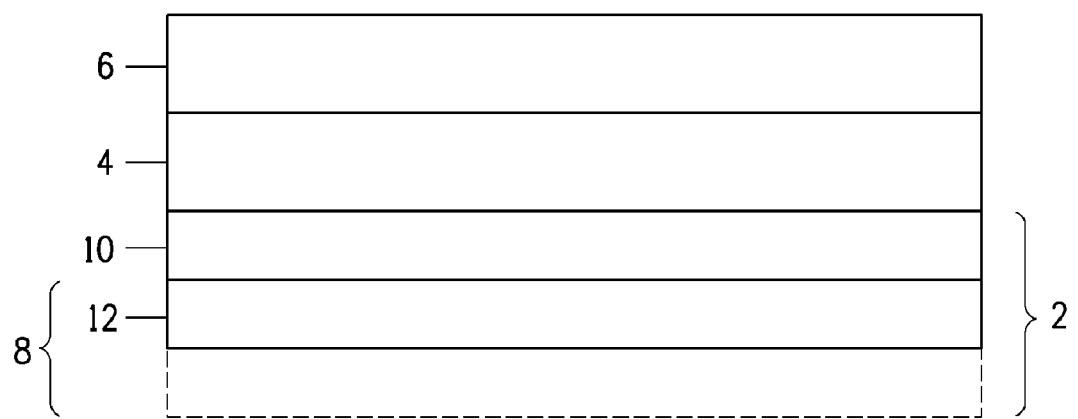
FIG. 1 contains a side elevation layout of the various constituent parts of a capacitor fabricated according to one embodiment of the methods hereof.

This invention provides methods of fabricating a capacitor, such as a thin-film capacitor, that involve the use of a substrate prepared from a non-copper metal. A non-copper metal is a metal that contains no, or only an insubstantial amount of, copper—as an impurity, for example, or as a component in a mixture such as an alloy. An insubstantial amount of copper in a non-copper metal is, for example, less than 1 wt %, or less than 0.1 wt %, or less than 0.01 wt %, or less than 0.001 wt %, copper based on the total weight of all metal components together in the non-copper metal.

The primary, or exclusive, metal components of a non-copper metal can, for example, be nickel, stainless steel, titanium, platinum, aluminum and/or vanadium. Nickel, or a nickel alloy, is preferred. Regardless of the choice of metal or metals as the non-copper metals from which the substrate is prepared, it is preferred to avoid organic impurities therein to the greatest extent possible. When nickel, for example, is used as the non-copper metal, a nickel having a compositional purity equivalent to or better than Ni 270 is preferred.

The substrate prepared from a non-copper metal that is provided to the method hereof can be prepared as a foil, which is characterized by being thin but self-supported and flexible. The non-copper metal substrate, prepared as a foil or otherwise, has the shape of a flat plane, and as such the magnitude of its dimensions of length and width (or breadth) are substantially greater than the magnitude of its dimension of depth. Although this condition of the large excess of dimensions of length and width/breadth relative to dimension of depth causes the planar substrate to be accurately characterized as being "thin", the dimension of its depth (and the dimension of the depth of the other deposited layers herein) is referred to herein as "thickness". A planar structure would be accurately characterized as having top and bottom surfaces, and the non-copper metal substrate used herein similarly has surfaces that are referred to herein as first and second surfaces.

In one embodiment, selecting a metal substrate of a greater rather than lesser thickness in the cross-section thereof is advantageous because, at increasing thicknesses, (a) the substrate has greater mechanical robustness and will be less likely to suffer damage, such as a wrinkle, as a result of handling during the other fabrications steps; (b) there is a greater probability that the grains of the metal are cylindrical, that they extend through the substrate from one surface thereof to the other, and that the length of grain boundaries intersecting the surface of the substrate per unit of surface area is reduced; and (c) there is a lower probability that grain boundaries intersecting the surface of the substrate would act as defect sources during the other fabrication steps, particularly the formation of the dielectric layer. The non-copper metal substrate that is provided to the method hereof may have a thickness that, for example, is 40 microns or more, or 55 microns or more, or 70 microns or more, and yet is 120 microns or less, 105 microns or less, or 90 microns or less. Preferably, the non-copper metal substrate has a uniform thickness.

In another embodiment of the methods hereof, the non-copper metal substrate may be annealed before the dielectric material is deposited on the first surface thereof. Annealing will typically improve the microstructural and chemical stability of the substrate, and will reduce that possibility that the formation of the dielectric layer on the first surface of the substrate, including the later exposure of the dielectric material itself to high temperature, would ultimately cause reduced performance in the resulting capacitor such as manifested by lower capacitance per unit area, dielectric loss and insulation resistance.

When the substrate is annealed, there appears to be a reduction of residual stresses that may have been a product of formation of the substrate itself, i.e. a reduction of dislocation density within the original grains, and/or the formation of stress-free recrystallized grains that are regularly equiaxed and that replace the original grains that were deformed as a result of grain boundary motion. The thermally-induced recrystallization provided by annealing appears to result in grains with a cylindrical shape that have boundaries that extend from one surface of the substrate to the other surface. The base diameter distribution of these cylindrical grains may, for example, be such that more than about 80% of the grains have a diameter larger than about 80% of the thickness measurement of the substrate.

A non-copper metal substrate can be exposed to higher temperatures and a greater concentration of oxygen than a copper substrate. Annealing of the non-copper metal substrate can be performed by heating the substrate to expose it to a temperature that is at least as high as about 35% of its melting point temperature for a period of at least about thirty (30) minutes. Annealing is preferably conducted in a reductive environment, in a vacuum or in a hydrogen atmosphere.

In another embodiment of the methods hereof, the extent of the roughness of the first surface of the non-copper substrate can be reduced before the dielectric material is deposited thereon. The extent of the roughness of the first surface of the substrate can affect the properties and performance of the dielectric layer to be formed thereon in a region at or close to the interface of the first surface and the dielectric layer. That region can have a thickness that scales with the root mean square ("rms") of the roughness of the substrate surface, and reducing the roughness of the first surface will thus decrease the probability that such roughness would adversely affect the performance of the dielectric layer in the capacitor. Properties of the dielectric layer that can be affected by the roughness of the first surface include, for example, the insulation resistance thereof and leakage currents. For example, relative to charge storage within a dielectric layer of a capacitor, leakage currents can scale with the rms of the roughness of the surface of the substrate with which the dielectric layer interfaces.

Reduction of the extent of the roughness rms of the first surface of the non-copper substrate can be accomplished with methods including those such as cold rolling with highly honed mirror-finished rolls, abrasive slurry polishing, abrasive slurry buffing, electrochemical polishing, and diamond turning. In electrochemical polishing, the peaks of the surface topography are typically removed at a faster rate than the valleys. In reducing the extent of the roughness rms of the first surface of the non-copper substrate, 15 percent or more, or 25 percent or more, or 35 percent or more, and yet 65 percent or less, or 55 percent or less, or 45 percent or less, of the thickness of the non-copper substrate, at this stage of the method hereof, may be removed. The first surface may, for example, be subjected to electrochemical polishing to provide thereon a topographical roughness with an rms of less than about 100 nm, less than about 50 nm or less than about 10 nm, for a surface profilometric sampling length of about 71 microns.

Roughness of a surface can be measured by contact or non-contact methods. Contact methods generally use a stylus that tracks small changes in surface height, and a skid that follows large changes in surface height. A diamond stylus is moved vertically in contact with a sample, and then moved laterally across the sample for a specified distance and specified contact force. A profilometer can measure small surface variations in vertical stylus displacement as a function of position. The use of the stylus and skid together reduces the effects of non-flat surfaces on the surface roughness measurement. The relative motion between the skid and the stylus is measured with a magnetic circuit and induction coils. The induction coils drive amplifiers, and other signal conditioning hardware. The then-amplified signal is used to drive a recorder that shows stylus position, and a digital readout that displays the roughness value.

The length of the path traced by the stylus is called the measurement length. The wavelength of the lowest frequency filter that will be used to analyze the data is usually defined as the sampling length. The measurement length is generally at least seven times longer than the sampling length, and is generally at least ten times longer than the wavelength of interesting features. The assessment length or evaluation length is the length of data that will be used for analysis. Commonly, one sampling length is discarded from each end of the measurement length. A typical profilometer can measure small vertical features ranging in height from 10 nanometers to 1 millimeter. The radius of diamond stylus ranges from 20 nanometers to 25 microns, and the horizontal resolution is controlled by the scan speed and data signal sampling rate. The stylus tracking force can range from less than 1 to 50 milligrams.

Non-contact methods of measuring surface roughness include laser triangulation (triangulation sensor), interferometry (vertical scanning interferometry, white-light interferometry, phase shifting interferometry), confocal microscopy, electron microscopy, atomic force microscopy, scanning tunneling microscopy, electrical capacitance, digital holography, and ultrasound. In the use of ultrasound, for example, a spherically focused ultrasonic sensor is positioned with a non normal incidence angle above the surface. The sensor sends out an ultrasonic pulse to a personal computer for analysis and calculation of roughness parameters.

In another embodiment of the methods hereof, a buffer layer can be deposited on the first surface before the dielectric material is deposited thereon. The buffer layer can serve as a barrier that (a) during the synthesis of the dielectric layer, blocks the diffusion of metal constituents into the dielectric layer; (b) during the synthesis of the dielectric layer, retards the formation of oxides that reduce the capacitance of the capacitor; and/or (c) decreases the rate at which metal is later removed from the second surface of the substrate. Thermally stimulated interdiffusion between the buffer layer and the first surface of the substrate can improve the adhesion of the buffer layer to the substrate, and can improve the chemical resistance provided by the buffer layer to protect the dielectric material during its formation into the dielectric layer.

When barium titanate [$BaTiO_3$ ("BT")], for example, is deposited as the dielectric material on a substrate that is a nickel foil by a physical vapor deposition process or a chemical solution deposition process, higher capacitance will be attained when there is an absence of NiO at the interface between the metal of the substrate and the deposited dielectric material. A physical vapor deposition process that sputter vaporizes a target of dielectric material onto the metal substrate will preferably be void of organics, but may nevertheless be susceptible to metal oxidation during the deposition of dielectric material, and/or to further oxidation at higher temperatures during the firing process to crystallize the dielectric material. Most metals suitable for use as the substrate will also have a native oxide layer on the surface thereof that will tend to lower the capacitance of the device, as described by the following equation of capacitors in series:

$$1/C_{total}=1/C_1+1/C_2+1/C_3+\ldots+1/C_n$$

where the total capacitance is dominated by the material with the lowest dielectric constant, in this example the NiO. By eliminating as much as possible the effect of any NiO with a buffer layer, the capacitance of the device will then be dominated by the properties of the deposited dielectric material, and a device with capacitance higher than 0.1 microfarad, and preferably higher than 1 microfarad, per square centimeter can typically be readily achieved.

Suitable materials from which a buffer layer may be formed are those that that will retard the diffusion of oxygen and/or metal components from the substrate into the dielectric material, and include, for example, SiC, TiAlN and nickel boride. A buffer layer may be applied to the first surface by physical vapor deposition, chemical vapor deposition, or electroless plating. The thickness of a buffer layer as applied to the first surface may be 1 micron or more, or 2 microns or more, or 3 microns or more, and yet 6 microns or less, or 5 microns or less, or 4 microns or less.

Dielectric material is deposited on the first surface of the metal substrate for the purpose of forming a dielectric layer thereon. In addition to barium titanate, a wide variety of dielectric materials can be used for such purpose, and examples of suitable dielectric materials include porcelain (ceramic), mica, quartz, sapphire, glass, and the oxides and nitrides of various metals such as aluminum, boron, beryllium, magnesium, silicon, strontium, tantalum, titanium and zirconium.

Dielectric materials can be applied to the first surface of the metal substrate in a solution by a variety of different coating techniques including chemical solution deposition, spin coating, immersion, brushing or doctor blading. Suitable solvents for the deposition of dielectric materials include alcohols, carboxylic acids and mixtures of alcohols and carboxylic acids. A more uniform coating of the solution of the dielectric material may be obtained on the metal substrate if the first surface of the metal substrate is degreased in an organic solvent such as acetone to increase wetting of the surface. A dielectric material, as deposited on the first surface of the non-copper metal substrate, can have a thickness that is about 0.1 micron or more, or about 0.25 micron or more, or about 0.5 micron or more, and yet about 2.0 micron or less, or about 1.75 micron or less, or about 1.5 micron or less.

Once a solution of dielectric material is coated on the substrate, the solvent is removed in an evaporation step, which can be performed, for example, by heating to a temperature of about 100° C. for a period of a few minutes ranging from about 1 to about 60 minutes. Following the desolvation of the deposited film, any organic components in the solution can be decomposed by further heating in a baking step at a temperature of about 250° C. to about 400° C. for a time of about 1 to about 60 minutes, after which a deposit of the dielectric material, or an amorphous precursor thereto, remains on the first surface of the metal substrate.

Barium titanate ("BT") is a particularly useful dielectric material, and it can be applied to the surface of the metal substrate, for example, by chemical solution deposition. In such chemical solution deposition, precursor molecules are deposited on the surface of the metal substrate, and the precursor molecules are carried in a solvent and contain ligands attached to the barium, the titanium and any dopant constituent to be used with the BT. Suitable barium and titanium (IV) precursors are of the type as represented by the structural formulae shown below:

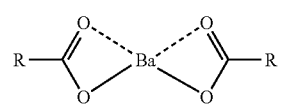

R = alkyl between $C_1$ and $C_{10}$

-continued

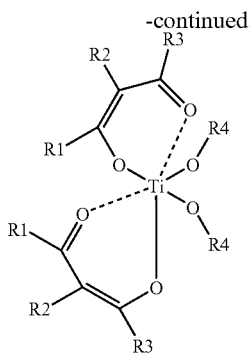

R1, R2, R3 = H, alkyl between C1 and C10
R4 = alkyl between C1 and C10

The barium and titanate components of the solution of the applied material may be doped with other constituents such as strontium, Group II elements, Group III elements, transition metals or rare earths.

The dielectric material, or amorphous precursor thereto, that has been thus deposited on the first surface of the metal substrate is then further heated in a crystallization step. As the dielectric material has been deposited on a non-copper substrate, the temperature of crystallization used may be significantly higher than a temperature that could be tolerated by a copper substrate. Crystallization may be performed at a temperature, for example, in excess of 500° C. Exposure of the metal substrate to temperatures above 400° C. for extended periods of time in air, however, can lead to oxidation of the metal in the substrate. The oxides formed as a result thereof would likely operate as defects in the interface between the metal substrate and the dielectric layer and yield lower capacitance values in the capacitor, which is undesirable. The dielectric material is therefore preferably crystallized by heating the metal substrate under a lower partial pressure of oxygen than exists in air. Heating the dielectric materials to a temperature of at least about 550° C., or at least about 750° C., in an atmosphere having an oxygen partial pressure in the range of about $10^{-8}$ atm to about $10^{-10}$ atm, for a period of time between about 10 seconds and about 2 hours, or between about 1 and about 60 minutes, is typically found suitable to crystallize the dielectric material while also retarding the oxidation of the metal in the substrate.

After the dielectric material is crystallized and formation of the dielectric layer is completed, conductive material is deposited on the dielectric layer to form an electrode thereon. Conductive materials suitable for use for such purpose include, for example, copper, nickel, silver, gold or platinum. Copper is preferred. Deposition of conductive material on the dielectric layer to form an electrode thereon may be performed, for example, by using techniques such as electroless plating, electrochemical plating, chemical solution deposition, chemical vapor deposition, plasma vapor deposition or thermal spraying. Conductive material, as deposited on the dielectric layer, can have a thickness that is about 1 micron or more, or about 1.5 microns or more, or about 3 microns or more, and yet about 20 microns or less, or about 16 microns or less, or about 12 microns or less.

Metal is then removed from the second surface of the metal substrate to reduce the thickness of the metal substrate. Metal can be removed from the second surface of the metal substrate using techniques such as mechanical abrasion (with papers and/or slurries), wet chemical dissolution, electrochemical dissolution (e.g. in an electrochemical bath), dry etching, thermal sublimation or ion beam sputtering. In removing metal from the second surface of the metal substrate to reduce the thickness thereof, there may be removal of about 15 percent or more, or about 25 percent or more, or about 35 percent or more, and yet about 90 percent or less, or about 75 percent or less, or about 60 percent or less, of the thickness of the non-copper substrate at that stage of the method of fabrication hereof (i.e. after formation of the dielectric layer and deposition of the electrode thereon).

After metal is removed from the second surface of the metal substrate, conductive material is deposited on the second surface of the metal substrate to form an electrode thereon. Conductive materials suitable for use for such purpose include, for example, copper, nickel, silver, gold or platinum. Copper is preferred. Deposition of conductive material on the second surface of the metal substrate to form an electrode thereon may be performed, for example, by using techniques such as electroless plating, electrochemical plating, chemical solution deposition, chemical vapor deposition, plasma vapor deposition or thermal spraying. Conductive material, as deposited on the second surface of the metal substrate, can have a thickness that is about 1 micron or more, or about 1.5 microns or more, or about 3 microns or more, and yet about 20 microns or less, or about 16 microns or less, or about 12 microns or less.

A capacitor as fabricated by a method of this invention may be further described by the side elevation view shown in FIG. 1. In FIG. 1, the elements of a capacitor shown are: a non-copper metal substrate before removal of any metal therefrom 2; a dielectric layer 4 disposed on the first surface of the substrate 2; a conductive metal electrode 6 disposed on the dielectric layer 4; the portion of the substrate removed from the second surface thereof 8; the portion of the substrate remaining after removal of metal from the second surface thereof 10; and a conductive metal electrode 12 disposed on the second surface of the substrate.

Other methods for fabricating a capacitor are disclosed in U.S. Pat. No. 7,029,971 and U.S. Patent Publication No. 2007/0049026, each of which is by this reference incorporated in its entirety as a part hereof.

In addition to vendors named elsewhere herein, materials as used in the methods hereof for fabrication of a capacitor may be made by processes known in the art, and/or are available commercially from suppliers such as Alfa Aesar (Ward Hill, Mass.), City Chemical (West Haven, Conn.), Fisher Scientific (Fairlawn, N.J.), Sigma-Aldrich (St. Louis, Mo.) or Stanford Materials (Aliso Viejo, Calif.).

The advantageous attributes and effects of the methods of this invention may be more fully appreciated from a series of illustrations, as set forth below, of various ways in which the methods hereof could be performed. The embodiments of the methods hereof on which the following illustrations are based are representative only, and the selection of those embodiments to describe the invention does not indicate that materials, components, reactants, conditions, techniques or steps not described in these illustrations are not suitable for practicing these methods, or that subject matter not described in these illustrations is excluded from the scope of the appended claims and equivalents thereof.

In the following illustrations, prior to spray coating, the bare metal of the metal substrate could be cleaned by sonication in 18 MOhm DI water, sonication in acetone, sonication in isopropyl alcohol ("IPA") and a final sonication in 18 MOhm DI water. Excess solvent would then removed using filtered compressed air jet. A 0.2M barium titanate ("BT") precursor formulation would then be prepared using the following procedure:

2,4 pentanedione (Acac) is degassed by a freeze/pump/thaw method on a Schlenk line over a bed of grade 4A molecular sieves and back filled with argon gas. In a nitrogen-filled drybox, 34.041 g of titanium(IV) n-butoxide (Acros; 0.100 moles) are placed into a 100 ml bottle, and 20.020 g of 2,4 pentanedione (0.200 moles; Aldrich) is then added dropwise and left to stir for 12 hours. In a fumehood, 31.750 g of barium hydroxide hydrate (0.101 moles; Aldrich) is added to a 500 ml volumetric flask. 200 ml of a 50:50 solution of 1-butanol/propanoic acid would then be added and stirred to form barium propanoate. The titanium solution [bis(acetylacetonato)/bis(butoxo)titanium] is then removed from the drybox and added to the volumetric flask containing the barium hydroxide solution. The round bottom flask is rinsed several times with 50:50 1-butanol:propanoic acid solution into the volumetric flask. A 50:50 1-butanol:propanoic acid solution is then added to the 500 ml flask up to the mark, and a stir bar is then added. The solution is stirred for an additional 12 hours.

The BT precursor formulation would then be spray coated with the following protocol:

1. Place foil on a XY precision motion stage located 2 inches below a stationary flat tip ultrasonic atomizing nozzle (8700-120; part number 06-04315MT) manufactured by Sonotek Corporation.
2. Filter the solution through a 0.2 micron filter into a syringe that is placed in a programmable syringe pump.
3. Dispense solution at 1 cc/min from the syringe pump into the nozzle now actuated by an ultrasonic generator running at 0.8 watts. A fine mist with a droplet Sauter mean diameter of 28 micrometer is generated which is entrained by a nitrogen flow of 7 SLM onto the surface of the substrate.
4. The substrate on the stage is coated in a back-and-forth motion underneath the nozzle at a speed of 24 m/min with a 0.5 cm index between neighboring passes covering the desired coatable footprint of the substrate.

After spray coating, each precursor sublayer would be dried in a two-step process in air at 150° C. for 5 min, then to 400° C. for 15 min.

After ten (10) sublayers are deposited and dried, one final firing step is executed to crystallize the BT layer. This step would be executed in a cryo-pumped stainless steel chamber having 10 mTorr of Ar flowing at 110 sccm, whereby the metal substrate is resistively-heated at 850° C. for 15 minutes by passing 60 Hz current through it. This protocol would yields a BT layer that is approximately 0.6 microns thick.

Illustration 1.

A 75 micron thick Ni 270 foil, available from HPM (Lancaster Pa.) in a cold-rolled condition, is cut into a strip measuring 3"×8.5". A central 3"×6" region of such strip is resistively-heated at 1000° C. for 30 minutes in 10 mTorr of Ar-4% $H_2$ flowing through a cryo-pumped stainless steel chamber. Such protocol yields a recrystallized microstructure comprising cylindrical grains with boundaries that extend from the top surface to the bottom surface of the foil.

The foil is now fastened against a plastic plate, and is connected to a DC power supply, to become the anode in an electrochemical cell; and is then partially immersed in a solution of 60 vol % $H_2SO_4$ and 200 mL/L of glycerin, leaving the top 1"×3" region outside the bath. A 3"×8.5" Ni 270 plate is connected to the other terminal of the DC power supply to act as a cathode, and is then is similarly immersed in the solution to face the anode with a 2" spacing. The solution is then thermostatically controlled via a serpentine plastic coil that uses circulating water held at 20° C. by an external heat exchanger. The bath is also well agitated with bubbling nitrogen. The Ni 270 substrate is then electrochemically polished at 300 mA/cm$^2$ for 20 minutes. Such protocol would produce a mirror-like surface with a roughness rms less than 20 nm for a surface profilometry sampling length of about 71 microns.

A central 6"-long region of the foil is then coated with a BT layer following the protocol described above using contact masks.

The top surface of the BT layer is then coated with copper through a contact mask, to form a first copper electrode layer, by means of DC-magnetron sputtering at 10 mTorr Ar using a target power density of 30 watts/cm$^2$ for 35 minutes. The contact mask exposes most of the BT surface to the copper vapors except a 0.125"-wide rim around the periphery of the 3"×6" BT-coated region. The thickness of this first copper electrode is about 10 µm.

The top surface of the first copper electrode is then brush coated with a thin layer of nail polish and is then fastened to a plastic plate by a Ni 270 contact shadow mask defining a central opening measuring 2.5"×5. The sandwich is then connected to a DC power supply to become the anode in an electrochemical cell, and then is immersed in a solution of 60 vol % $H_2SO_4$ and 200 mL/L of glycerin. A Ni 270 plate is connected to the other terminal of the DC power supply to act as a cathode, and is then immersed in the solution to face the anode with a 2" spacing. The solution is then thermostatically controlled via a serpentine plastic coil that uses circulating water held at 20° C. by an external heat exchanger. The bath is also well agitated with bubbling nitrogen. The Ni 270 substrate is then electrochemically thinned at 300 mA/cm$^2$ for 20 minutes. The residual thickness of the Ni foil substrate would now be less than about 9 microns.

The electrochemically thinned region is then cut off from the original 3"×8.5" coated foil. The 2.5"×5" specimen is now placed on the table of a sputtering reactor. A contact shadow mask, defining a central 2"×2" opening, is placed on top of the specimen. The reactor table is now RF ignited as a cathode at a power density of 0.25 watts/cm$^2$ for 15 minutes in 10 mTorr of Ar-4% $H_2$. Subsequently, the masked specimen would then be coated with copper, to form a second copper electrode layer, by means of DC-magnetron sputtering at 10 mTorr Ar using a target power density of 30 watts/cm$^2$ for 35 minutes. The thickness of this second copper electrode is about 10 microns.

The 2.5"×5" specimen is now immersed in acetone to remove the nail polish painted on the first copper electrode layer.

Illustration 2.

A 75 µm thick Ni 270 foil, available from HPM (Lancaster Pa.) in a cold-rolled condition, is cut into a strip measuring 3"×8.5". The foil would then be fastened against a plastic plate and be connected to a DC power supply, to become the anode in an electrochemical cell, and then be partially immersed in a solution of 60 vol % $H_2SO_4$ and 200 mL/L of glycerin, leaving the top 1"×3" region outside the bath. A 3"×8.5" Ni 270 plate is connected to the other terminal of the DC power supply to act as a cathode, and is then is similarly immersed in the solution to face the anode with a 2" spacing. The solution is then thermostatically controlled via a serpentine plastic coil that uses circulating water held at 20° C. by an external heat exchanger. The bath is also well agitated with bubbling nitrogen. The Ni 270 substrate is then electrochemically polished at 300 mA/cm$^2$ for 20 minutes. Such protocol would produce a mirror-like surface with a roughness rms less than 20 nm for a surface profilometry sampling length of about 71 microns.

A central 3"×6" region of such strip would then be resistively-heated at 1000° C. for 30 minutes in 10 mTorr of Ar-4%

H$_2$ flowing through a cryo-pumped stainless steel chamber. Such protocol yields a recrystallized microstructure comprising cylindrical grains with boundaries that extend from the top surface to the bottom surface of the foil.

A central 6"-long region of the foil is then coated with a BT layer following the protocol described above using contact masks.

The top surface of the BT layer is then coated with copper through a contact mask, to form a first copper electrode layer, by means of DC-magnetron sputtering at 10 mTorr Ar using a target power density of 30 watts/cm$^2$ for 25 minutes. The contact mask exposes most of the BT surface to the copper vapors except a 0.125"-wide rim around the periphery of the 3"×6" BT-coated region. The thickness of this first copper electrode is about 10 µm.

The top surface of the first copper electrode is then brush coated with a thin layer of nail polish and is then fastened to a plastic plate by a Ni 270 contact shadow mask defining a central opening measuring 2.5"×5. The sandwich is then connected to a DC power supply, to become the anode in an electrochemical cell, and then is immersed in a solution of 60 vol % H$_2$SO$_4$ and 200 mL/L of glycerin. A Ni 270 plate is connected to the other terminal of the DC power supply to act as a cathode, and is then immersed in the solution to face the anode with a 2" spacing. The solution is then thermostatically controlled via a serpentine plastic coil that uses circulating water held at 20° C. by an external heat exchanger. The bath is also well agitated with bubbling nitrogen. The Ni 270 substrate is then electrochemically thinned at 300 mA/cm$^2$ for 20 minutes. The residual thickness of the Ni substrate is now approximately less than 9 microns.

The electrochemically thinned region would then be cut off from the original 3"×8.5" coated foil. The 2.5"×5" specimen would then be placed on the table of a sputtering reactor. A contact picture frame mask, having a 2"×2" opening, is placed on top of the specimen. The reactor table is now RF ignited as a cathode at a power density of 0.25 watts/cm$^2$ for 15 minutes in 10 mTorr of Ar-4% H$_2$. Subsequently, the masked specimen would then be coated with copper, to form a second Cu electrode layer, by means of DC-magnetron sputtering at 10 mTorr Ar using a target power density of 30 watts/cm$^2$ for 35 minutes. The thickness of this second copper electrode would be about 10 microns.

The 2.5"×5" specimen would then be immersed in acetone to remove the nail polish painted on the first copper electrode layer.

Illustration 3.

A 75 micron thick Ni 270 foil, available from HPM (Lancaster Pa.) in a cold-rolled condition, would be cut into a strip measuring 3"×8.5". A central 3"×6" region of such strip is resistively-heated at 1000° C. for 30 minutes in 10 mTorr of Ar-4% H$_2$ flowing through a cryo-pumped stainless steel chamber. Such protocol yields a recrystallized microstructure comprising cylindrical grains with boundaries that extend from the top surface to the bottom surface of the foil.

The foil is now fastened against a plastic plate and is connected to a DC power supply, to become the anode in an electrochemical cell, and then is partially immersed in a solution of 60 vol % H$_2$SO$_4$ and 200 mL/L of glycerin, leaving the top 1"×3" region outside the bath. A 3"×8.5" Ni 270 plate is connected to the other terminal of the DC power supply to act as a cathode, and is then similarly immersed in the solution to face the anode with a 2" spacing. The solution is then thermostatically controlled via a serpentine plastic coil that uses circulating water held at 20° C. by an external heat exchanger. The bath is also well agitated with bubbling nitrogen. The Ni 270 substrate is then electrochemically polished at 300 mA/cm$^2$ for 20 minutes. Such protocol would produce a mirror-like surface with a roughness rms less than 20 nm for a surface profilometry sampling length of about 71 microns.

The foil would then be coated with TaN in a DC-magnetron sputtering system fitted with a Ta target (99.95% purity). The operation is run using 10 mTorr of a gas mixture Ar-25% N$_2$ and a tantalum target power density of 30 watts/cm$^2$ for 30 minutes. Such protocol would encoat nominally a 3 micron thick TaN layer.

A central 6"-long region of the foil is then coated with a BT layer following the protocol described above using contact masks.

The top surface of the BT layer is then coated with copper through a contact mask, to form a first copper electrode layer, by means of DC-magnetron sputtering at 10 mTorr Ar using a target power density of 30 watts/cm$^2$ for 35 minutes. The contact mask exposes most of the BT surface to the copper vapors except a 0.125"-wide rim around the periphery of the 3"×6" BT-coated region. The thickness of this first copper electrode is about 10 micron.

The top surface of the first copper electrode is then brush coated with a thin layer of nail polish and is then fastened to a plastic plate by a Ni 270 contact shadow mask defining a central opening measuring 2.5"×5. The sandwich is then connected to a DC power supply, to become the anode in an electrochemical cell, and then is immersed in a solution of 60 vol % H$_2$SO$_4$ and 200 mL/L of glycerin. A Ni 270 plate is connected to the other terminal of the DC power supply to act as a cathode, and is then immersed in the solution to face the anode with a 2" spacing. The solution is then thermostatically controlled via a serpentine plastic coil that uses circulating water held at 20° C. by an external heat exchanger. The bath is also well agitated with bubbling nitrogen. The Ni 270 substrate is then electrochemically thinned at 300 mA/cm$^2$ for 20 minutes. The residual thickness of the Ni foil substrate would then be approximately less than 9 microns.

The electrochemically thinned region is then cut off from the original 3"×8.5" coated foil. The 2.5"×5" specimen is now placed on the table of a sputtering reactor. A contact shadow mask, defining a central 2"×2" opening, is placed on top of the specimen. The reactor table is now RF ignited as a cathode at a power density of 0.25 watts/cm$^2$ for 15 minutes in 10 mTorr of Ar-4% H$_2$. Subsequently, the masked specimen is coated with copper, to form a second Cu electrode layer, by means of DC-magnetron sputtering at 10 mTorr Ar using a target power density of 30 watts/cm$^2$ for 35 minutes. The thickness of this second copper electrode is about 10 microns.

The 2.5"×5" specimen would then be immersed in acetone to remove the nail polish painted on the first copper electrode layer.

Illustration 4.

A 75 micron thick Ni 270 foil, available from HPM (Lancaster Pa.) in a cold-rolled condition, is cut into a strip measuring 3"×8.5". The foil is fastened against a plastic plate and is connected to a DC power supply, to become the anode in an electrochemical cell, and then is partially immersed in a solution of 60 vol % H$_2$SO$_4$ and 200 mL/L of glycerin, leaving the top 1"×3" region outside the bath. A 3"×8.5" Ni 270 plate is connected to the other terminal of the DC power supply, to act as a cathode, and is then is similarly immersed in the solution to face the anode with a 2" spacing. The solution is then thermostatically controlled via a serpentine plastic coil that uses circulating water held at 20° C. by an external heat exchanger. The bath is also well agitated with bubbling nitrogen. The Ni 270 substrate is then electrochemically polished at 300 mA/cm$^2$ for 20 minutes. Such protocol produces a mirror-like surface with a roughness rms less than 20 nm for a surface profilometry sampling length of about 71 microns.

A central 3"×6" region of such strip is resistively-heated at 1000° C. for 30 minutes in 10 mTorr of Ar-4% $H_2$ flowing through a cryo-pumped stainless steel chamber. Such protocol yields a recrystallized microstructure comprising cylindrical grains with boundaries that extend from the top surface to the bottom surface of the foil.

The foil would then be coated with TaN in a DC-magnetron sputtering system fitted with a tantalum target (99.95% purity). The operation is run using 10 mTorr of a gas mixture Ar-25% $N_2$ and a tantalum target power density of 30 watts/$cm^2$ for 30 minutes. Such protocol would encoat nominally a 3 micron thick TaN layer.

A central 6"-long region of the foil is then coated with a BT layer following the protocol described above using contact masks.

The top surface of the BT layer is then coated with copper through a contact mask, to form a first copper electrode layer, by means of DC-magnetron sputtering at 10 mTorr Ar using a target power density of 30 watts/$cm^2$ for 35 minutes. The contact mask exposes most of the BT surface to the copper vapors except a 0.125"-wide rim around the periphery of the 3"×6" BT-coated region. The thickness of this first copper electrode is about 10 microns.

The top surface of the first copper electrode is then brush coated with a thin layer of nail polish and is then fastened to a plastic plate by a Ni 270 contact shadow mask defining a central opening measuring 2.5"×5. The sandwich is then connected to a DC power supply, to become the anode in an electrochemical cell, and then is immersed in a solution of 60 vol % $H_2SO_4$ and 200 mL/L of glycerin. A Ni 270 plate is connected to the other terminal of the DC power supply to act as a cathode, and is then immersed in the solution to face the anode with a 2" spacing. The solution is then thermostatically controlled via a serpentine plastic coil that uses circulating water held at 20° C. by an external heat exchanger. The bath is also well agitated with bubbling nitrogen. The Ni 270 substrate is then electrochemically thinned at 300 mA/$cm^2$ for 20 minutes. The residual thickness of the Ni foil substrate would then be approximately less than 9 microns.

The electrochemically thinned region is then cut off from the original 3"×8.5" coated foil. The 2.5"×5" specimen is placed on the table of a sputtering reactor. A contact picture frame mask, having a 2"×2" opening, is placed on top of the specimen. The reactor table is RF ignited as a cathode at a power density of 0.25 watts/$cm^2$ for 15 minutes in 10 mTorr of Ar-4% $H_2$. Subsequently, the masked specimen is coated with copper, to form a second Cu electrode layer, by means of DC-magnetron sputtering at 10 mTorr Ar using a target power density of 30 watts/$cm^2$ for 35 minutes. The thickness of this second copper electrode would be about 10 microns.

The 2.5"×5" specimen would then be immersed in acetone to remove the nail polish painted on the first copper electrode layer.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present.

In this specification, unless explicitly stated otherwise or indicated to the contrary by the context of usage, amounts, sizes, ranges, formulations, parameters, and other quantities and characteristics recited herein, particularly when modified by the term "about", may but need not be exact, and may also be approximate and/or larger or smaller (as desired) than stated, reflecting tolerances, conversion factors, rounding off, measurement error and the like, as well as the inclusion within a stated value of those values outside it that have, within the context of this invention, functional and/or operable equivalence to the stated value.

What is claimed is:

1. A method of fabricating a capacitor, comprising:
   (a) providing a non-copper metal substrate that has first and second surfaces, wherein the non-copper metal substrate has a thickness in the range between about 40 microns and 120 microns;
   (b) annealing the non-copper metal substrate;
   (c) polishing the first surface of the non-copper metal substrate;
   (d) coating the first surface of the non-copper metal substrate with a buffer layer;
   (e) depositing a dielectric material on the first surface of the non-copper metal substrate to form a dielectric layer thereon, wherein the depositing the dielectric material is formed after the annealing the non-copper metal substrate, the polishing the first surface of the non-copper metal substrate, and the coating the first surface of the non-copper metal substrate with the buffer layer;
   (f) depositing a first conductive material on the dielectric layer to form an electrode thereon;
   (g) removing non-copper metal from the second surface of the non-copper metal substrate to reduce the thickness of the non-copper metal substrate; and
   (h) depositing a second conductive material on the whole of the second surface of the non-copper metal substrate to form an electrode thereon.

2. The method according to claim 1 wherein the non-copper metal substrate has a uniform thickness.

3. The method according to claim 1 wherein the non-copper metal substrate comprises a foil.

4. The method according to claim 1 wherein the non-copper metal comprises nickel.

5. The method according to claim 1 wherein annealing the non-copper metal substrate comprises heating the non-copper metal substrate at a temperature greater than or equal to about 35% of its melting temperature for a period of time of at least about 30 minutes.

6. The method according to claim 1 wherein polishing the first surface of the non-copper metal substrate provides thereon a topographical roughness with an rms≦about 100 nm for a surface profilometric sampling length of about 71 microns.

7. The method according to claim 1 wherein the first and second conductive material deposited in step (f) and/or step (h) comprises copper.

8. The method according to claim 1 wherein step (g) comprises exposing the second surface of the non-copper metal substrate to an electrochemical bath.

* * * * *